United States Patent
Hu et al.

(10) Patent No.: US 12,328,992 B2
(45) Date of Patent: Jun. 10, 2025

(54) DISPLAY PANEL HAVING REDUCED REFLECTION AREA OF CATHODE LAYER, AND DISPLAY DEVICE

(71) Applicant: Hubei Yangtze Industrial Innovation Center of Advanced Display Co., LTD., Wuhan (CN)

(72) Inventors: Liang Hu, Wuhan (CN); Ai Xiao, Wuhan (CN)

(73) Assignee: Hubei Yangtze Industrial Innovation Center of Advanced Display Co., LTD., Wuhan (CN)

( * ) Notice: Subject to any disclaimer, the term of this patent is extended or adjusted under 35 U.S.C. 154(b) by 668 days.

(21) Appl. No.: 17/696,795

(22) Filed: Mar. 16, 2022

(65) Prior Publication Data
US 2023/0067011 A1    Mar. 2, 2023

(30) Foreign Application Priority Data
Aug. 26, 2021 (CN) .......................... 202110988464.8

(51) Int. Cl.
*H10K 59/122* (2023.01)
*H10K 50/86* (2023.01)
*H10K 59/131* (2023.01)

(52) U.S. Cl.
CPC ......... *H10K 59/122* (2023.02); *H10K 50/865* (2023.02); *H10K 59/131* (2023.02)

(58) Field of Classification Search
CPC combination set(s) only.
See application file for complete search history.

(56) References Cited

U.S. PATENT DOCUMENTS

| | | | | |
|---|---|---|---|---|
| 11,093,072 B2* | 8/2021 | Hu | ......... | H10D 30/673 |
| 2017/0199410 A1* | 7/2017 | Jiang | ......... | G02F 1/133345 |
| 2019/0227671 A1* | 7/2019 | Hu | ......... | G06F 3/04164 |
| 2019/0302959 A1* | 10/2019 | Clark | ......... | G06F 3/0412 |
| 2021/0175460 A1* | 6/2021 | Baek | ......... | H10K 50/824 |
| 2021/0408203 A1* | 12/2021 | Shi | ......... | H01L 27/124 |

(Continued)

FOREIGN PATENT DOCUMENTS

| | | |
|---|---|---|
| CN | 106981585 A | 7/2017 |
| CN | 107808897 A | 3/2018 |
| CN | 108292488 A | 7/2018 |

(Continued)

*Primary Examiner* — Nduka E Ojeh
(74) *Attorney, Agent, or Firm* — Anova Law Group, PLLC

(57) ABSTRACT

A display panel and a display device are provided. The display panel includes a substrate; an auxiliary metal layer, an anode layer, a pixel definition layer, a light-emitting layer, and a cathode layer, sequentially disposed on a side of the substrate. The pixel definition layer includes barrier wall structures defining openings exposing the anode layer, the light-emitting layer is at least located in openings, the cathode layer includes cathode blocks located in openings, and the auxiliary metal layer includes first metal wiring portions extending along a first direction; and cathode connection lines located among the cathode blocks. Cathode connection lines connect the cathode blocks in openings and, along a direction perpendicular to a plane of the substrate, at least a portion of the cathode connection lines are parallel to multiple first metal wiring portions adjacent to the portion of the cathode connections lines.

20 Claims, 9 Drawing Sheets

(56) References Cited

U.S. PATENT DOCUMENTS

2022/0383811 A1* 12/2022 Liu ..................... G09G 3/3233
2023/0004253 A1* 1/2023 Shin ..................... G06F 3/0446

FOREIGN PATENT DOCUMENTS

| CN | 110112182 A | 8/2019 |
| CN | 110610980 A | 12/2019 |
| CN | 112133730 A | 12/2020 |
| CN | 112133731 A | 12/2020 |
| CN | 112216805 A | 1/2021 |
| CN | 112885971 A | 6/2021 |
| WO | 2021016947 A1 | 2/2021 |

* cited by examiner

DISPLAY PANEL HAVING REDUCED REFLECTION AREA OF CATHODE LAYER, AND DISPLAY DEVICE

CROSS-REFERENCE TO RELATED APPLICATION

This application claims the priority of Chinese Patent Application No. 202110988464.8, filed on Aug. 26, 2021, the content of which is incorporated by reference in its entirety.

TECHNICAL FIELD

The present disclosure generally relates to the field of display technology and, more particularly, relates to a display panel and a display device including the display panel.

BACKGROUND

The organic self-luminous display panel does not need to be provided with a backlight due to its self-luminous characteristics. Thus, compared with the liquid crystal display panel, the organic self-luminous display panel is lighter and thinner. Moreover, the organic self-luminous display panel also has the advantages of high brightness, low power-consumption, fast response, high definition, good flexibility, and high luminous efficiency, which can meet the new demands of consumers for display technology.

However, there is still a need to provide a display panel and a display device with improved display effect. The disclosed display panels and display devices are directed to solve some problems in the arts.

SUMMARY

One aspect of the present disclosure provides a display panel. The display panel includes a substrate, and an auxiliary metal layer, an anode layer, a pixel definition layer, a light-emitting layer and a cathode layer, sequentially disposed on a side of the substrate. The pixel definition layer includes a plurality of barrier wall structures, the plurality of barrier wall structures define a plurality of openings exposing the anode layer, the light-emitting layer is at least located in the plurality of openings, the cathode layer includes cathode blocks located in the plurality of openings, and the auxiliary metal layer includes a plurality of first metal wiring portions extending along a first direction. The display panel may also include a plurality of cathode connection lines located among the cathode blocks. The plurality of cathode connection lines connect the cathode blocks in the plurality of openings and, along a direction perpendicular to a plane where the substrate is located, at least a portion of the plurality of cathode connection lines are parallel to multiple first metal wiring portions of the plurality of first metal wiring portions adjacent to the portion of the plurality of cathode connection lines.

Another aspect of the present disclosure provides a display device. The display device includes a display panel. The display panel includes a substrate, and an auxiliary metal layer, an anode layer, a pixel definition layer, a light-emitting layer and a cathode layer, sequentially disposed on one side of the substrate. The pixel definition layer includes a plurality of barrier wall structures, the plurality of barrier wall structures define a plurality of openings exposing the anode layer, the light-emitting layer is at least located in the plurality of openings, the cathode layer includes cathode blocks located in the plurality of openings, and the auxiliary metal layer includes a plurality of first metal wiring portions extending along a first direction. The display panel also includes a plurality of cathode connection lines located among the cathode blocks. The plurality of cathode connection lines connect the cathode blocks in the plurality of openings and, along a direction perpendicular to a plane where the substrate is located, at least a portion of the plurality of cathode connection lines are parallel to multiple first metal wiring portions of the plurality of first metal wiring portions adjacent to the portion of the plurality of cathode connection lines.

Other aspects of the present disclosure can be understood by those skilled in the art in light of the description, the claims, and the drawings of the present disclosure.

BRIEF DESCRIPTION OF THE DRAWINGS

The drawings incorporated in the specification and constituting a part of the specification illustrate the embodiments of the present disclosure, and together with the description are used to explain the principle of the present disclosure.

DETAILED DESCRIPTION

To make the above-mentioned objects, features and advantages of the present disclosure more obvious and understandable, the present disclosure will be further described below with reference to the accompanying drawings and embodiments.

It should be noted that specific details are set forth in the following description to fully understand the present disclosure. However, the present disclosure can be implemented in many other ways different from those described herein, and those skilled in the art can make similar generalizations without violating the connotation of the present disclosure. Therefore, the present disclosure is not limited by the specific embodiments disclosed below.

In general, a light-emitting element in an organic light-emitting display panel includes an anode, a light-emitting layer, and a cathode. The cathode is often formed by a vacuum evaporation process to coat the entire surface. Because of the characteristics of the material of the cathode, the cathode has a very strong absorption and reflection to light. When the external light enters the organic light-emitting display panel, it will be reflected at the cathode, which will affect the brightness of the light. Accordingly, the human eyes will perceive slight display unevenness and screen color changes, etc. Furthermore, the cathode with the entirely covered surface will be uneven due to the underlying metal film layer, thereby forming an irregular blazed grating. For example, when the grating is engraved into a zigzag line groove section, the light energy of the grating will be focused on a predetermined direction, i.e., a certain spectral level. When detecting from such a predetermined direction, the intensity of the spectrum is the maximum. Therefore, when a blazed grating with uneven size and slope inclination is formed on the cathode surface, the brightness of the reflected light at different locations of the cathode will be uneven, resulting in unbalanced light visible to the human eyes, and an asymmetric rainbow pattern is formed on the display panel.

Figure 1:
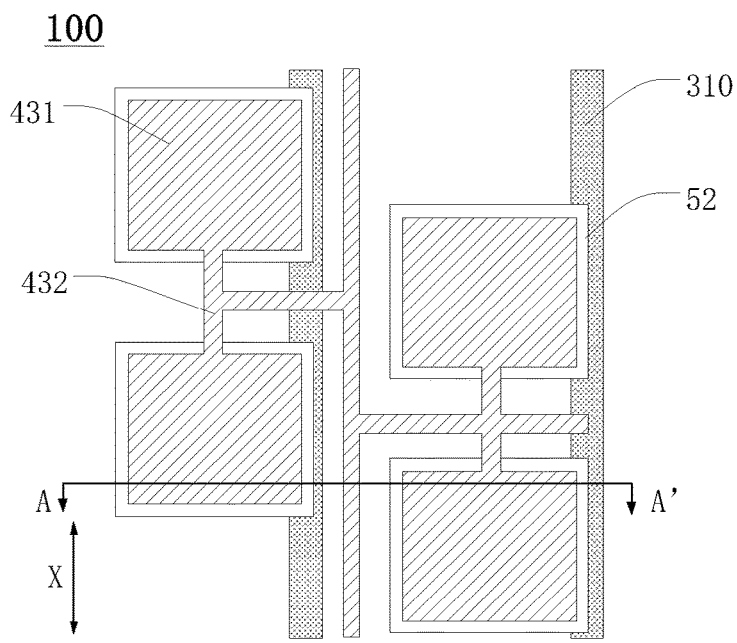
FIG. 1 illustrates a top view of an exemplary display panel according to various disclosed embodiments of the present disclosure.
Figure 2:
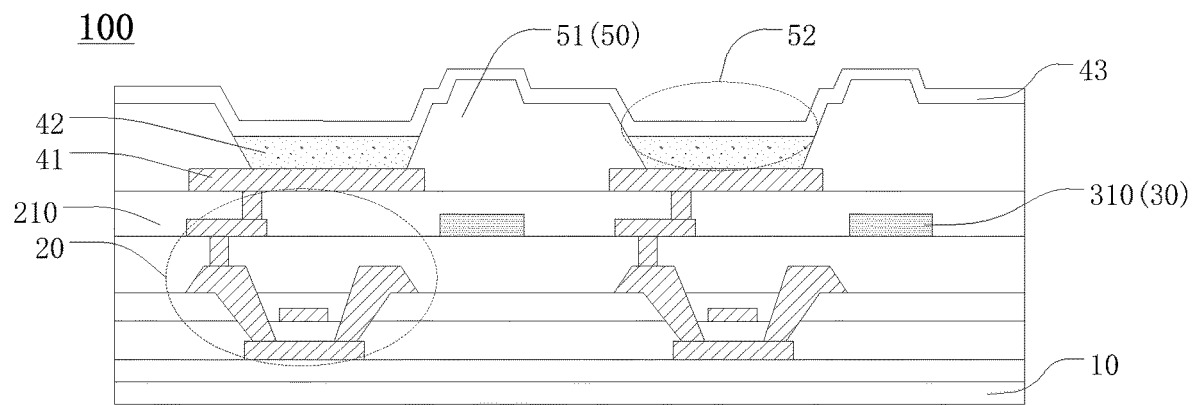
FIG. 2 illustrates an A-A' sectional view of the layer structure of the display panel in FIG. 1.

The present disclosure provides a display panel and a display device, with an improved display effect. FIG. 1 is a top view of an exemplary display panel consistent with various disclosed embodiments of the present disclosure; and FIG. 2 is an A-A'-sectional view of a layer structure of the display panel shown in FIG. 1. It should be noted that the schematic diagram of the layer structure here refers to the schematic diagram of the layer structure stacking perpendicular to the plane where the display panel is located, and the following similar drawings will not be repeated.

As shown in FIGS. 1-2, the display panel 100 may include a substrate 10, and an auxiliary metal layer 30, an anode layer 41, a pixel definition layer 50, a light-emitting layer 42, and a cathode layer 43 sequentially disposed on one side of the substrate 10. The pixel definition layer 50 may include a plurality of barrier wall structures 51. The plurality of barrier wall structures 51 may define a plurality of openings 52 exposing the anode layer 41. The light-emitting layer 42 may be disposed at least in the openings 52. The cathode layer 43 may at least include cathode blocks 431 disposed in the plurality of openings 52. The auxiliary metal layer 30 may include a plurality of first metal wiring portions 310 extending along a first direction X. The display panel 100 may further include a plurality of cathode connection lines 432 located between the cathode blocks 431. The cathode connection lines 432 may connect the cathode blocks 431 in the plurality of openings 52. Along a direction perpendicular to the plane of the substrate 10, at least a portion of the cathode connection lines 432 may be parallel to the adjacent first metal wiring portions 310.

In one embodiment, the auxiliary metal layer 30 may be one or more of metal wirings that may provide electrical signals for the light-emitting element, such as, the source voltage signal lines (i.e., the signal lines used to transmit the positive source voltage signal PVDD in the pixel circuits), the data lines, the scan lines, and the reference voltage signal lines, etc.

In one embodiment, the cathode layer 43 may be made of a single-layer material composed of IZO, ITO, or AZO, etc. In some embodiments, the cathode layer may be a composite material composed of metals, such as Mg, Al, Ag and one or more of IZO, ITO, and AZO, etc.

In general, the cathode layer is usually formed by a vapor deposition process on the entire surface of the cathode conductive layer covering multiple light-emitting elements. When a material with a higher reflectivity is used as the cathode, the cathode has a strong light absorption and reflection, resulting in a large loss of light of the OLED display panel with the cathode layer provided on the entire surface, and further reducing the light exiting rate of the display panel. In present disclosed display panel, the cathode layer may include cathode blocks located in the plurality of openings and cathode connection lines connecting adjacent cathode blocks. For example, the cathode layer may be further patterned to form a distribution with a specific shape. Such a patterning process may at least remove portions of the cathode layer. Thus, the reflection surface of the cathode layer may be reduced, and the absorption and reflection of light by the cathode layer may be reduced; and the light exiting efficiency of the display panel may be increased.

It should be noted that at least a portion of the cathode connection lines may be parallel to the adjacent first metal wiring portions. The "at least a portion" may refer to at least one cathode connection line. The adjacent first metal wiring portion may refer to the metal wiring portions located under the cathode connection lines and closest to the cathode connection lines. In this paragraph, that one film layer is "under" another film layer may mean that one film layer is located on the side of the other film layer adjacent to the substrate 10. In the following description, that one film layer is "above" the other film layer may mean that one film layer is located on the side of the other film layer away from the substrate 10, which will not be repeated hereafter.

In the OLED structure, the thickness of the data line and the source voltage signal line (i.e., the signal line used to transmit the positive source voltage signal PVDD in the pixel circuit) under the cathode layer may be generally 7700 angstroms along the direction perpendicular to the plane where the substrate is located. This will make the cathode layer produce uneven areas, and the cathodes on the uneven areas mostly have a sawtooth-shaped slot section. The inclined surface on the uneven cathode area may be used as the grating reflection surface, and the smooth surface of the cathode in the flat area may be used as the grating surface Among them, the grating reflection surface may be a groove surface that plays a diffractive effect, and it may form an angle with the grating surface, that is, the bottom surface of the grating, thereby forming a blazed grating structure. However, due to the diversity and uneven shape of the wirings underneath, the structure of the uneven area may also be different, resulting in the great difference of the blazed grating structures in different areas of the cathode layer, and making the intensity of the reflected light in different areas uneven, and causing the rainbow pattern phenomenon visible to human eyes. The present disclosed display panel may be able to reduce the reflection area of the cathode layer by patterning the cathode layer. In the present design, the influence of the cathode on the light emitted by the light-emitting layer itself may only be limited by the characteristics of the cathode blocks above the light-emitting layer. Therefore, without changing the cathode blocks above the light-emitting layer, the shapes, sizes, and areas of the cathode connection lines located in the non-light-emitting area of the display panel (for example, above the pixel definition layer) may not affect the display effect of the light emitted by the light-emitting layer itself. Further, reducing the coverage area of the cathode layer may reduce the area of uneven areas as much as possible, thereby reducing the complexity of the grating structures in the non-light-emitting area, and reducing the uneven display caused by the different intensity of reflected light in different areas caused by the grating structure phenomenon. In addition, the patterned cathode connection lines may be parallel to the adjacent first metal wiring portions, which may reduce the formation of reflective slopes along other directions. Even if the uneven area may not be completely eliminated, the blazed grating structures formed in the uneven area may be substantially same, which may reduce the asymmetry of the blazed grating structures and may balance the intensity of reflected light in different regions.

In one embodiment of the present disclosure, the cathode layer may be patterned into the cathode blocks in the pixel openings and the cathode connection lines connecting the cathode blocks to reduce the reflection area of the cathode layer. Thus, the reflection of the external light by the cathode layer may be reduced. At the same time, the metal wirings under the cathode layer may be set parallel to the cathode connection lines, which may reduce the formation of the reflective slopes on the cathode layer to avoid the formation of irregular blazed grating structures along these directions. Accordingly, the problem of unevenness of the brightness of the display screen caused by blazed grating may be solved.

In one embodiment, referring to FIG. 2, the display panel 100 may further include a driving transistor 20 located between the pixel definition layer 50 and the substrate 10. The auxiliary metal layer 30 may be located on the side of the driving transistor 20 away from the substrate 10. The driving transistor 20 may be further provided with a planarization layer 210 on the side away from the substrate 10. In one embodiment, the first metal wiring portions 310, such as power supply voltage signal lines (used to transmit power signal in a pixel circuit) and data lines, etc., may be in the planarization layer 210. In some embodiments, the first metal wiring portions may be located on the side of the planarization layer away from the substrate. For example, the first metal wiring portion may be an anode. The driving transistor 20 may be electrically connected to the light-emitting element (including the anode 41, the light-emitting layer 42 and the cathode layer 43), and may be used to drive the light-emitting element to emit light.

Figure 3:
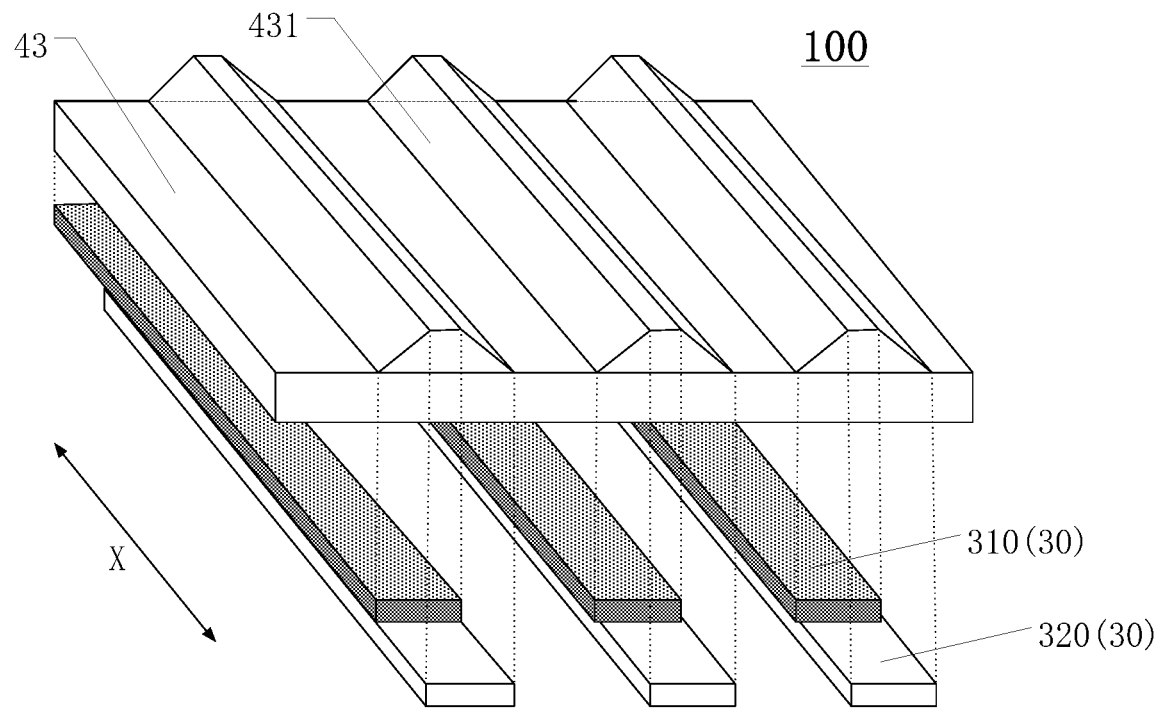
FIG. 3 illustrates a partial view of an exemplary display panel according to various disclosed embodiments the present disclosure.

FIG. 3 is a schematic diagram of a portion of an exemplary display panel according to various disclosed embodiments of the present disclosure. As shown in FIG. 3, in one embodiment, the auxiliary metal layer 30 may also include a plurality of second metal wiring portions 320 extending along the first direction X. The first metal wiring portions 310 and the second metal wiring portions 320 may be in different layers. The orthographic projections of the first metal wiring portions 310 on the substrate 10 and the orthographic projections of the second metal wiring portions 320 on the substrate 10 may have overlapping portions. It should be noted that having overlapping portions may mean completely overlapping or partially overlapping in the display area. In the embodiment of the present disclosure, it may only need to design the first metal wiring portions 310 and the second metal wiring portions 320 to overlap each other to achieve the effect of further reducing the uneven areas, and the size of the overlapping portion may not be limited here. Because the second metal wiring portions 320 and the first metal wiring portions 310 may both extend along the first direction X, for example, the overlapping portions may also extend along the first direction X, the extension direction and shape and size of the sloped reflection surface of the uneven cathode region formed after overlapping may be same, which may ensure the uniformity of the convexity of the upper cathode corresponding to the overlapping portions, and the formation of reflective slopes in other directions may be reduced as much as possible. At the same time, the areas of uneven regions may also be reduced.

Figure 4:
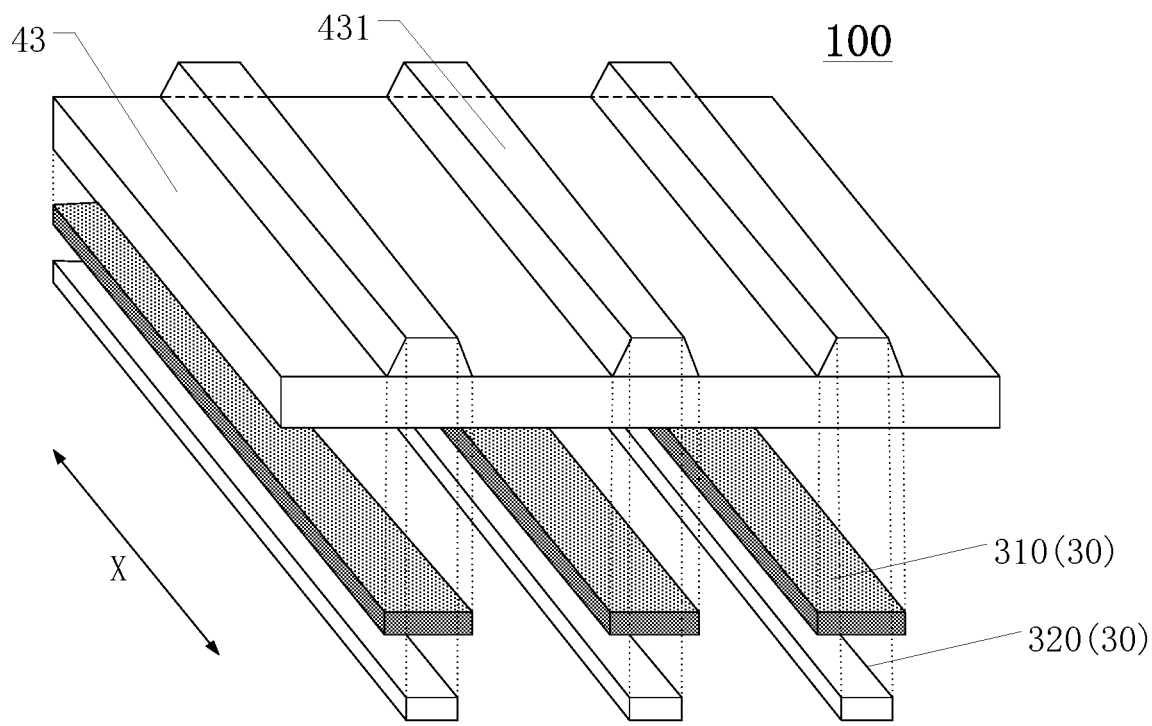
FIG. 4 illustrates a partial view of another exemplary display panel according to various disclosed embodiments the present disclosure.

In one embodiment, the first metal wiring portion may be a source voltage signal line, and the second metal wiring portion may be a data line. Specifically, the source voltage signal line may be a signal line used to transmit the positive source voltage signal PVDD in the pixel circuit; and the data signal line may be used to transmit the data signal. The thickness of the source voltage signal line and the data line along the direction perpendicular to the plane where the substrate is located may be about 7700 angstroms. The irregular distribution of the two signal lines may cause the unevenness of the cathode layer above the two signal lines to be further increased, or to be more irregular. Thus, overlapping the two signal lines may reduce the uneven area of the cathode layer. The width of the source voltage signal line may be generally 5 μm, and the width of the data line may be generally 2-3 μm. Referring to FIG. 4, which is a schematic diagram of a portion of another exemplary display panel provided by an embodiment of the present disclosure, the orthographic projection of the first metal wiring portion on the substrate may cover the orthographic projection of the second metal wiring portion on the substrate. For example, the uneven cathode area caused by the second metal wiring portion may be located in the uneven cathode area caused by the first metal wiring portion. Thus, the uneven layer of the upper cathode layer area corresponding to the overlapping portion of the two metal wiring portions may be made steeper, for example, the angle between the reflective surface of the cathode slope and the flat surface of the cathode may become larger. In another word, the angle between the groove surface and the grating surface may become larger. Such an angle may be referred to as the blaze angle of the blaze grating. The larger the blaze angle, the smaller the corresponding reflected light intensity. Thus, the reflected light intensity may be further reduced.

In one embodiment of the present disclosure, by arranging the first metal wiring portion and the second metal wiring portion to be along the same extending direction and to overlap with each other, the uniformity of the protrusion degree of the upper cathode of the corresponding overlapping portion may be ensured. At the same time, the formation of the uneven area of the upper cathode may be avoided. In addition, along the direction perpendicular to the plane where the substrate is located, the first metal wiring portion may cover the second metal wiring portion, which may also make the slope angle of the formed cathode uneven area more steep, increase the blaze angle of the blazed grating, thereby reduce the brightness of the blazed grating, and reduce the reflected light intensity of the display panel.

Figure 5:
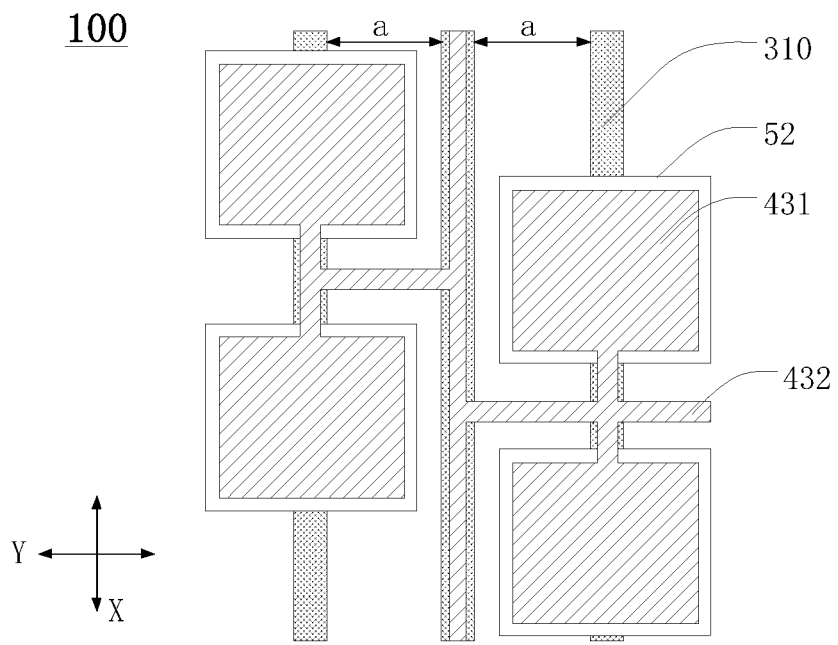
FIG. 5 illustrates a top view of another exemplary display panel according to various disclosed embodiments of the present disclosure.

FIG. 5 is a top view of another exemplary display panel consistent with various disclosed embodiments of the present disclosure. As shown in FIG. 5, the first metal wiring portions 310 having overlapping portions with the cathode connection wires 432 may be arranged at an equal interval a along the second direction Y that may be perpendicular to the first direction X and parallel to the plane of the substrate 10. After the cathode connection line 432 overlaps with the first metal wiring portion 310, an uneven area may be generated, and the uneven area may lead to the formation of a blazed grating. Thus, in one embodiment of the present disclosure, by arranging all the first metal wring portions having the overlapping portions with the cathode connection lines to be at an equal interval along a single direction to form a regularly arranged blazed grating structure, the reflected light intensity at different positions of the display panel may be uniformed, and the rainbow patterns caused by the uneven display brightness may be reduced.

Figure 6:
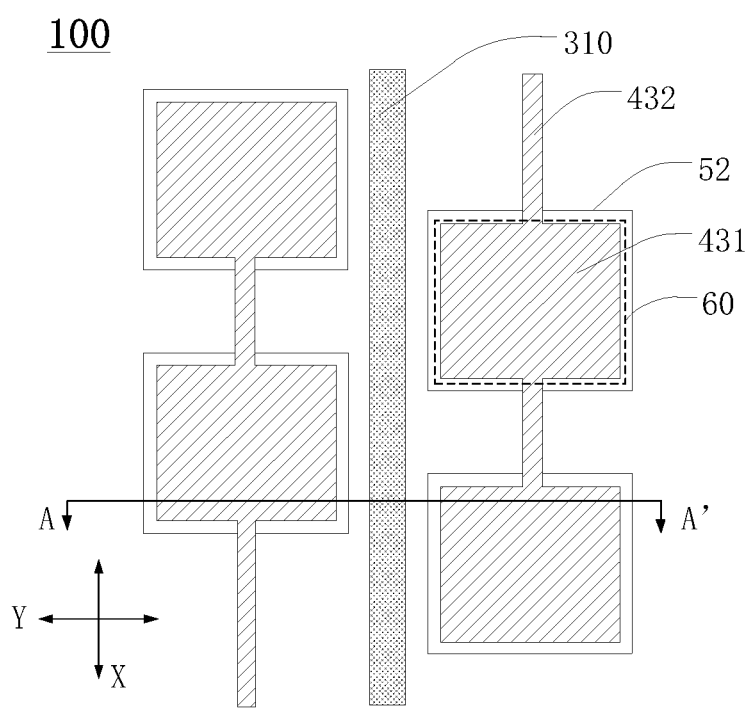
FIG. 6 illustrates a top view of another exemplary display panel according to various disclosed embodiments of the present disclosure.
Figure 7:
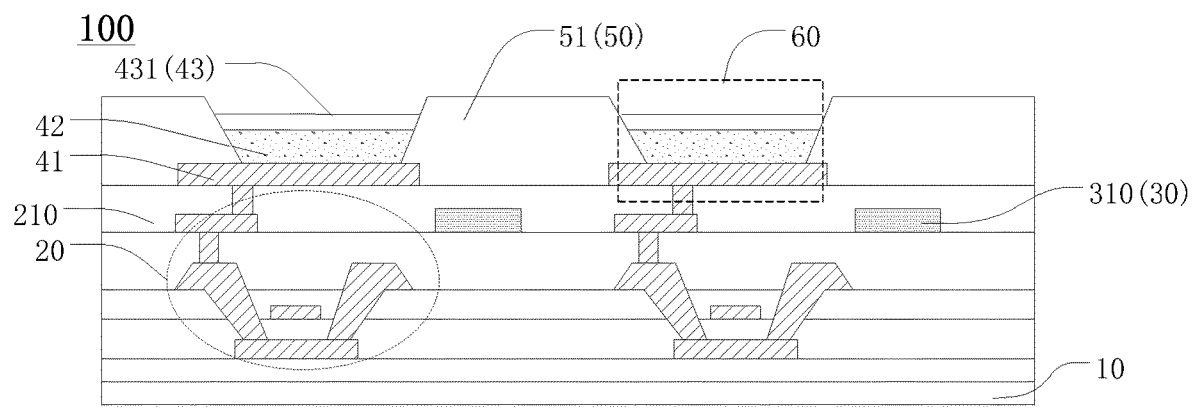
FIG. 7 illustrates an A-A'-sectional view of the layer structure of the display panel in FIG. 6.

FIG. 6 is a top view of another exemplary display panel consistent with various disclosed embodiments of the present disclosure, and FIG. 7 is a schematic diagram of a layer structure of the display panel shown in FIG. 6 along the A-A' direction. As shown in FIGS. 6-7, the area where the light-emitting layer 42 is located may form a plurality of light-emitting areas 60, and along a direction perpendicular to the plane of the substrate 10, the first metal wiring portions 310 may not overlap the light-emitting areas 60; and/or, the first metal wiring portions 310 and the cathode connection lines 432 may not overlap each other. It is understandable that the uneven light in the light-emitting areas 60 may greatly affect the display effect of the display panel, and because the cathode blocks 431 may be formed on the light-emitting layer 42, that the first metal wiring portion 310 may not overlap the light-emitting area 60 may mean that the first metal wiring portion 310 and the cathode block 431 may not overlap each other. For example, the first metal wiring portion may not affect the flatness of the cathode block above the light-emitting layer, the possibility of forming a blazed grating may be reduced, and the effect to the display effect of the light-emitting area may be avoided to the greatest extent. However, the first metal wiring portions and the cathode connection lines may not overlap. Thus, no uneven area may be formed on the cathode connection lines. For example, in one embodiment of the present disclosure, the first metal wiring portions may be completely away from the positions of the cathode blocks and the cathode connection lines. Thus, the first metal wirings may not affect the flatness of the upper cathode, and the formation of blazed gratings may be avoided.

Figure 8:
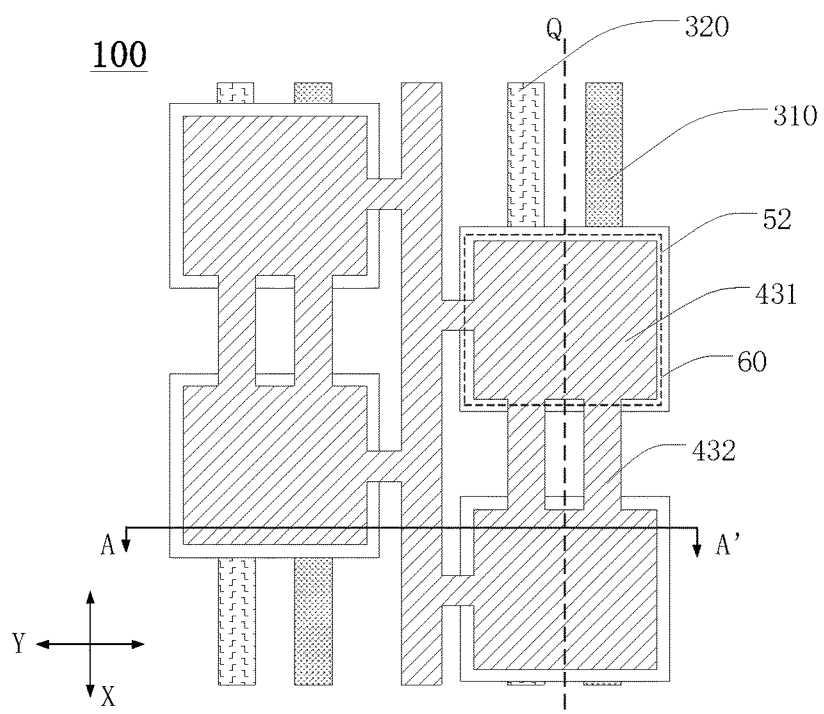
FIG. 8 illustrates a top view of another exemplary display panel according to various disclosed embodiments of the present disclosure.
Figure 9:
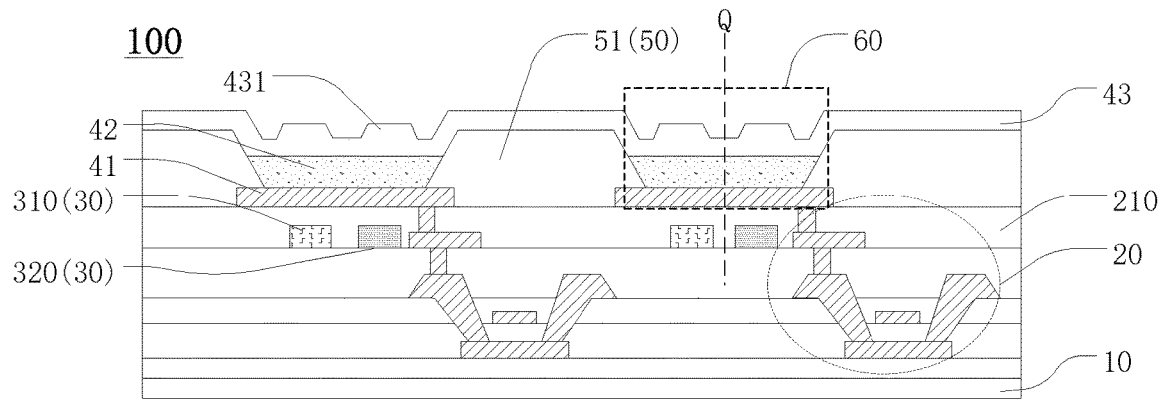
FIG. 9 illustrates an A-A'-sectional view of the layer structure of the display panel in FIG. 8.

FIG. 8 is a top view of another exemplary display panel according to various disclosed embodiments of the present disclosure; and FIG. 9 is a schematic diagram of a layer structure of the display panel in FIG. 8 along the A-A' direction. As shown in FIGS. 8-9, the auxiliary metal layer 30 may also include a plurality of second metal wiring portions 320 extending along the first direction X. The area where the light-emitting layer 42 is located may form a plurality of light-emitting areas 60. Along the direction perpendicular to the plane where the substrate 10 is located, the first metal wiring portion 310 and the second metal wiring portion 320 in a same light-emitting area 60 may be symmetrical along a first center line. The first center line may be the first central symmetry axis Q of the light-emitting area 60, and the first central symmetry axis Q of the light-emitting area 60 may be parallel to the first direction X. In the display panel design, along the direction parallel to the plane where the substrate is located, the width of the opening defined by the pixel definition layer may be generally 10 μm-20 μm, and the width of the metal wirings that provide electrical signals may be in a range of approximately 3 μm-5 μm. When the metal wirings are arranged in a variety of ways, there may be a situation where the metal wirings overlap with the light-emitting layer. For example, the lower metal wring may affect the flatness of the cathode block above the light-emitting layer. To further reduce the unevenness of the distribution of the size and shape of the blazed grating structure caused by the uneven distribution of the uneven areas on the cathode blocks, the metal wirings arranged under the cathode blocks may be arranged in a certain regularity to maintain the uniform distribution of the blazed grating structure.

In one embodiment of the disclosure, the metal wirings under the light-emitting area may be symmetrically arranged along the center line of the light-emitting area such that the blazed grating structures formed in a single light-emitting area may be uniformly distributed, and the intensity of reflected light along different directions in the single light-emitting area may be uniform.

Figure 10:
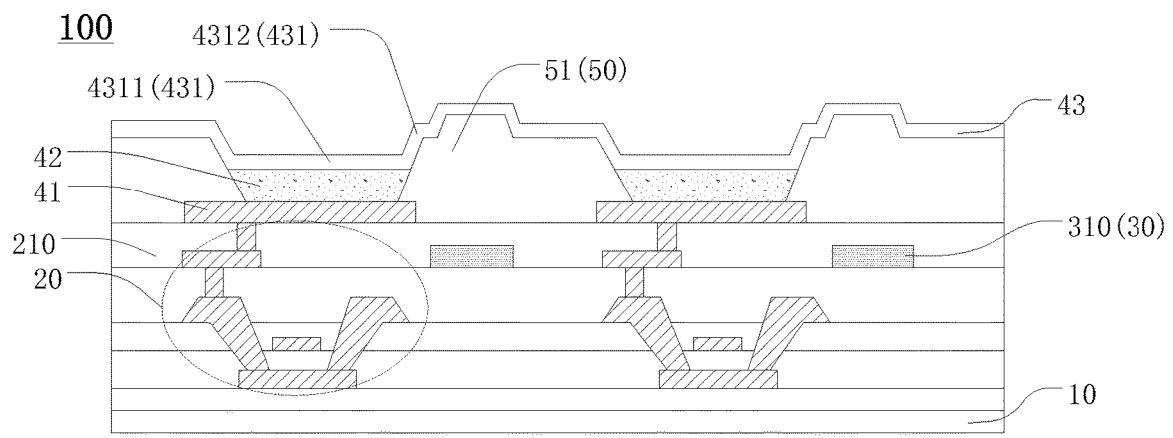
FIG. 10 illustrates a layer structure of another exemplary display panel according to various disclosed embodiments of the present disclosure.

FIG. 10 is a schematic diagram of a layer structure of another exemplary display panel according to various disclosed embodiments of the present disclosure. As shown in FIG. 10, in one embodiment, the cathode block 431 may include a first cathode 4311 and a second cathode 4312 connected to each other. The first cathode 4311 may be parallel to the plane of the substrate 10, and the second cathode 4312 may be located on the side of the first cathode 4311 away from the substrate 10 and at least a portion of the sidewall of the barrier structure 51. The cathode connection line 432 may be located on the surface of the barrier structure 51 away from the substrate 10 and may be connected to the first cathode 4311 through the second cathode 4312. In the fabrication process of the OLED light-emitting layer, the cathode layer may be formed by an evaporation process. For example, the corresponding cathode material may be heated under a certain vacuum condition to melt (or sublime) the corresponding cathode material into a vapor composed of atoms, molecules or atomic groups, and then condensate through the corresponding mask to form a film layer on the surface of the substrate 10. To ensure that the cathode layer covers each light-emitting layer, the cathode layer may extend along the surface of the light-emitting layer to the side of the barrier structure 51 and the first cathode 4311 and the second cathode 4312 may be formed, respectively.

Figure 11:
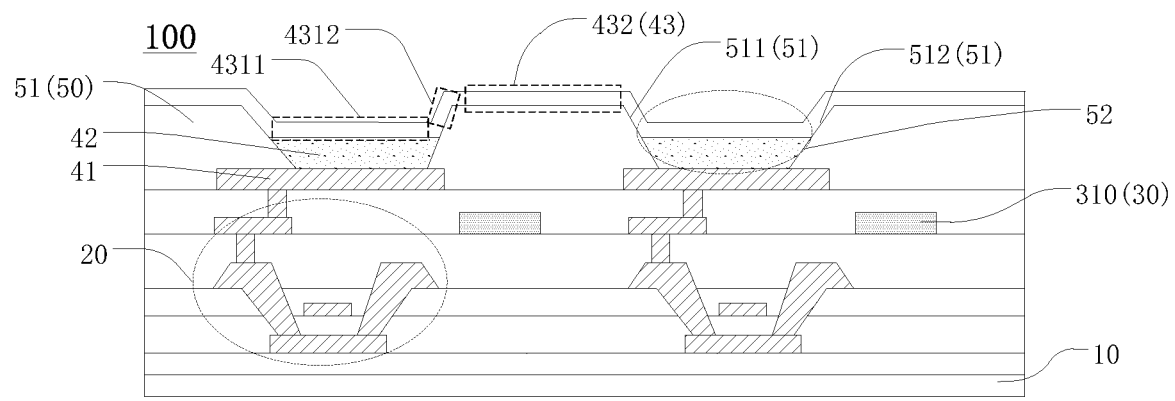
FIG. 11 illustrates a layer structure of another exemplary display panel according to various disclosed embodiments of the present disclosure.
Figure 12:
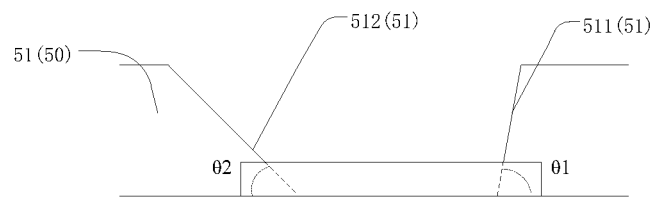
FIG. 12 illustrates a cross-sectional view of a portion of the display panel in FIG. 11.

FIG. 11 is a schematic diagram of a layer structure of another exemplary display panel according to an embodiment of the present disclosure. Along the direction where the cathode layer 43 points to the substrate 10, the width of the barrier structure 51 may be continuously increased. The barrier structure 51 may include a first sidewall 511 and a second sidewall 512 facing the opening 52. FIG. 12 is a partial cross-sectional view of the display panel shown in FIG. 11. Referring to FIGS. 11-12, an angle between the first sidewall 511 and a surface of the pixel definition layer 50 connected to the first sidewall 511 and on the side adjacent to the substrate 10 may be referred to as a first angle $\theta 1$, and an angle between the second sidewall 512 and a surface of the pixel definition layer 50 connected to the second sidewall 512 and adjacent to the substrate 10 may be referred to as a second angle θ2. In one embodiment, 30°<θ2<θ1<90°.

It should be noted that the first sidewall and the second sidewall may not be necessarily located on the same barrier wall structure, but may also be on different barrier wall structures.

In the process for forming the barrier wall structures, trapezoidal or inverted trapezoidal openings may be formed after exposure and development. For example, the sidewall of the barrier wall structure may have a certain slope, and the second cathode may be located on the sidewall of the barrier wall structure, then the second cathode may also generate a blazed grating structure because the slope angle may form a reflection slope. Because 30°<θ2<θ1<90°, the slope angle of the sidewall of the barrier wall structure corresponding to the cathode portion (the second cathode) connecting the first cathode and the cathode connection line may be smaller than the slope angle of the other sidewalls of the barrier wall structure. Under such a condition, the slope angle of the barrier wall structure may be equivalent to the blaze angle of the blazed grating formed by the second cathode. The larger the blaze angle, the weaker the reflection intensity. Therefore, in the embodiment of the present disclosure, the second cathode may be arranged at a position where the slope angle is relatively large such that the blaze angle of the formed blazed grating may be substantially large, and the reflected light there may be reduced.

Figure 13:
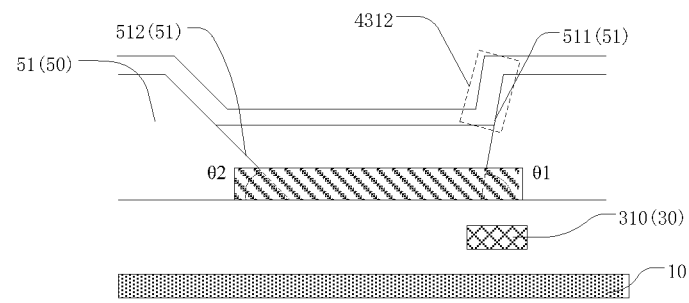
FIG. 13 illustrates another cross-sectional view of a portion of the display panel in FIG. 11.

FIG. 13 is another partial cross-sectional view of the display panel shown in FIG. 11. As shown in FIG. 13, along a direction perpendicular to the plane where the substrate 10 is located, the second cathode 4312 and the first metal wiring portion 310 may be parallel and may overlap each other. It can be seen from the above embodiment that the second cathode may form a reflective slope due to the slope angle and then may produce a blazed grating structure. In this regard, the overlap of the first metal wiring portion 310 and the second cathode 4312 may make the second cathode 4312 protruding to fill out this slope angle or form a steeper slope angle; and the intensity of the blazed grating may be reduced.

Figure 14:
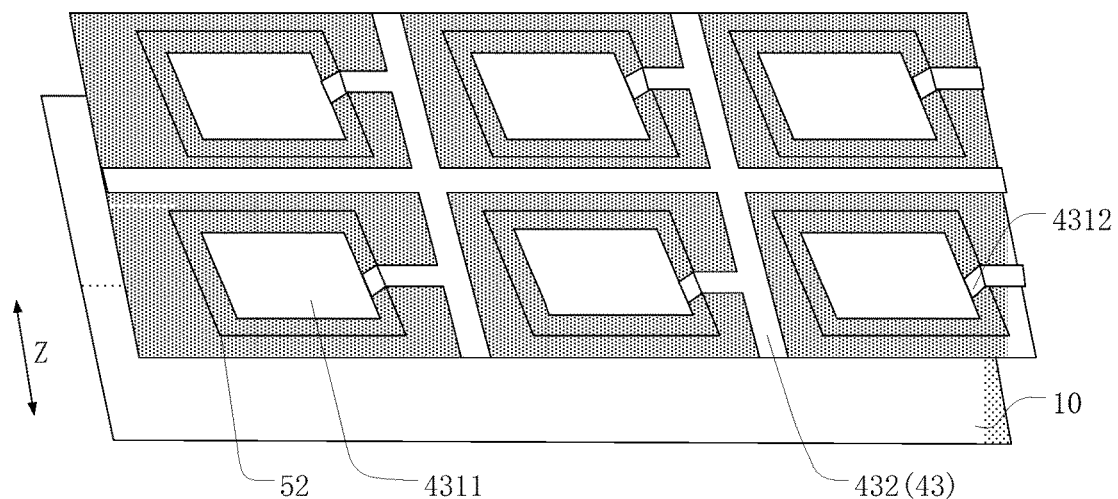
FIG. 14 illustrates a portion of another exemplary display panel consistent with various disclosed embodiments of the present disclosure.

FIG. 14 illustrates a portion of another exemplary display panel consistent with various disclosed embodiments of the present disclosure. As shown in FIG. 14, the second cathodes 4312 may be periodically arranged along the third direction Z. The third direction may be parallel to the plane where the substrate 10 is located. It should be noted that the third direction Z may not specifically refer to a single direction, and that the second cathodes 4312 may be periodically arranged along the third direction Z may indicate that a single second cathode 4312 may be used as a repeating unit and may be periodically arranged along a single or multiple directions, or multiple second cathodes 4312 may be as repeating units, and periodically arranged along a single or multiple directions. Such arrangements may be to form a regular arrangement of the second cathodes 4312 such that the blazed gratings may also be regularly distributed to reduce the phenomenon of uneven dispersion.

Figure 15:
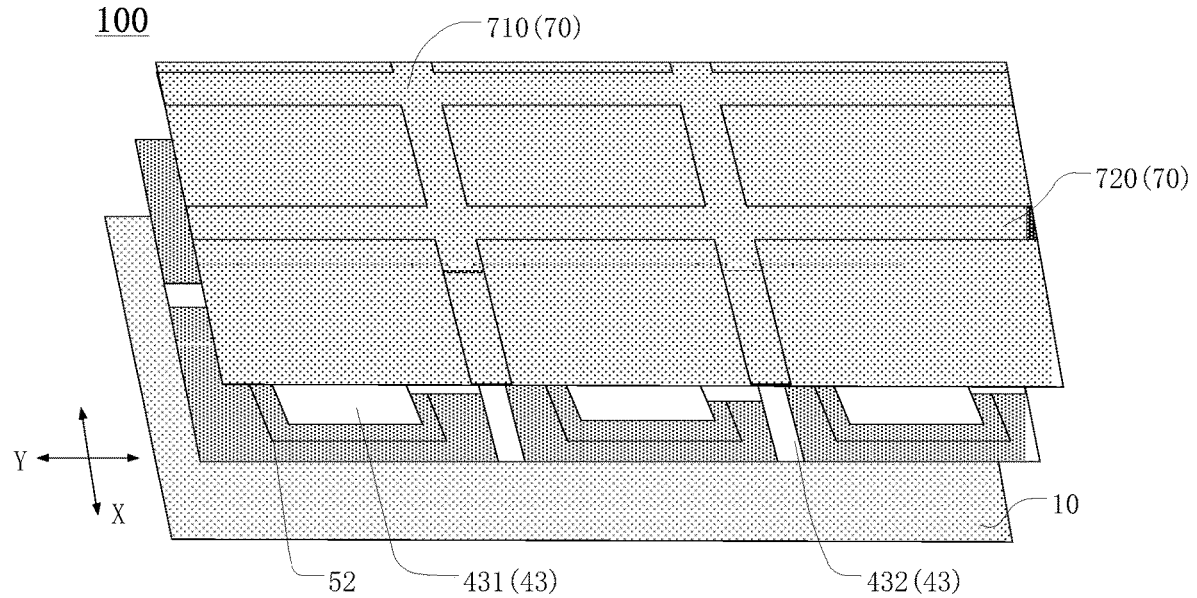
FIG. 15 illustrates a portion of another exemplary display panel consistent with various disclosed embodiments of the present disclosure.

FIG. 15 illustrates a portion of another exemplary display panel according to various disclosed embodiments of the present disclosure. As shown in FIG. 15, the display panel 100 may further include a black matrix 70 located on the side of the cathode connection line 432 away from the substrate 10. The black matrix 70 may include a plurality of first black matrix units 710 extending along the first direction X and arranged along the second direction Y, and a plurality of second black matrix units 720 extending along the second direction Y and arranged along the first direction X. The plurality of first black matrix units 710 and the plurality of second black matrix units 720 intersect each other to expose the openings 52. The second direction Y and the first direction X may intersect each other, and may be both parallel to the plane of the substrate 10.

The black matrix may usually be made of a material with high light-shielding performance to prevent the crosstalk between the light emitted from adjacent light-emitting units and improve the contrast between pixels.

It should be noted that the plurality of first black matrix units 710 and the plurality of second black matrix units 720 may intersect each other to expose the opening 52, for example, the plurality of first black matrix units 710 and the plurality of second black matrix units 720 may all be in the non-opening area. The plurality of stripe-shaped first black matrix units 710 and the plurality of stripe-shaped second black matrix units 720 may overlap each other to form a plurality of grid structures, and the plurality of grid structures may correspond to the plurality of openings 52 such that the light emitted by the light-emitting layer can be emitted out from grid structures formed by the black matrix units.

Along the direction perpendicular to the plane where the substrate 10 is located, at least a portion of the first black matrix units 710 may cover the cathode connection lines 432. It should be noted that that at least a portion of the first black matrix units 710 may cover the cathode connection lines 432 may indicate that the area of the black matrix units may be larger than the area of the cathode connection lines, or the area of the black matrix units and the areas of the second cathode connection lines may be equal and may completely overlap each other. Increasing the overlap area as much as possible may make the area of the covered cathode connection lines as large as possible; and the reflection of external light from the cathodes may be reduced.

In the prior art, the surface width of the barrier wall structure of the pixel definition layer away from the substrate is about 20 μm, and the width of the black matrix unit is in a range of 10 μm-20 μm. To reduce the effect of the metal wirings under the cathode to the flatness of the cathode, the cathode connection lines may be disposed on the barrier wall structure. However, due to the large square resistance of the commonly used cathode materials, there is a problem of high cathode resistivity. When the size of the OLED display is small, the voltage drop of the cathode may be ignored. But when the size of the display is large, the voltage drop of the cathode, at this time, is not negligible and is directly reflected on the screen. Accordingly, it will cause the problem of uneven display brightness. Increasing the size of the cathode may further increase its conductivity, and reduce the voltage drop of the display panel. In the present disclosure, the cathode blocks may be located in the openings, and their size may be difficult to change. Thus, the size that can be changed may be the sizes of the cathode connection lines on the surface of the barrier wall structures. For example, the conductivities of the cathodes may be improved by changing the sizes of the cathode connection lines.

Referring to FIG. 15, the central axis P of at least a portion of the first black matrix units 710 may coincide with the central axis of the cathode connection lines 432 covered by the first black matrix units. When the human eyes look at the display panel from a front perspective, the cathode connection lines may reflect a same amount of light from the two opposite sides along the second direction Y, or neither reflect light to improve the uniformity of light reflected by the display panel.

In the embodiment of the present disclosure, the reflection of the cathode may be reduced by the cathode connection lines by covering the surface of the barrier wall structure using the black matrix. At the same time, the width of the cathode connection line may be set as same as possible with the width of the black matrix unit. On the other hand, because the cathode connection line may be covered by the black matrix, there may be no further reflection.

It is known that when the size of the display screen is large, the cathode has a large square resistance due to the material, so the voltage drop may not be ignored. When the cathode driving signal is conducted from the edge of the substrate to the center, due to the square resistance of the cathode, the brightness of the center area and the edge of the screen may be uneven. Further, because of the patterning of the cathode layer, the reduction in the area of the cathode may further increase the voltage drop of the cathode. In this regard, in one embodiment, the cathode connection line may be a double-layered wiring. In the embodiment of the present disclosed, the double-layered cathode connection line may further increase the area of the cathode, increase the conductivity, and thereby reduce the voltage drop.

In addition to further increasing the area of the cathode, the conductivity of the cathode may also be improved by introducing a metal material with a high conductivity. In one embodiment, the double-layered wirings may be electrically connected through a first transition portion, and the conductivity of the first transition portion may be greater than the conductivity of the double-layered wirings. This may mean that, compared to the cathode, the first transition portion may have a better conductivity. When the cathode driving signal is transmitted from the edge to the center of the substrate, because the first transition portion may have a better conductivity, the difference between the amount of current transmitted to the center and the amount of current delivered to the edge may be substantially small. Thus, the problem of uneven display caused by the low brightness in the center area of the screen may be solved, and the display effect of the display panel may be improved.

Figure 16:
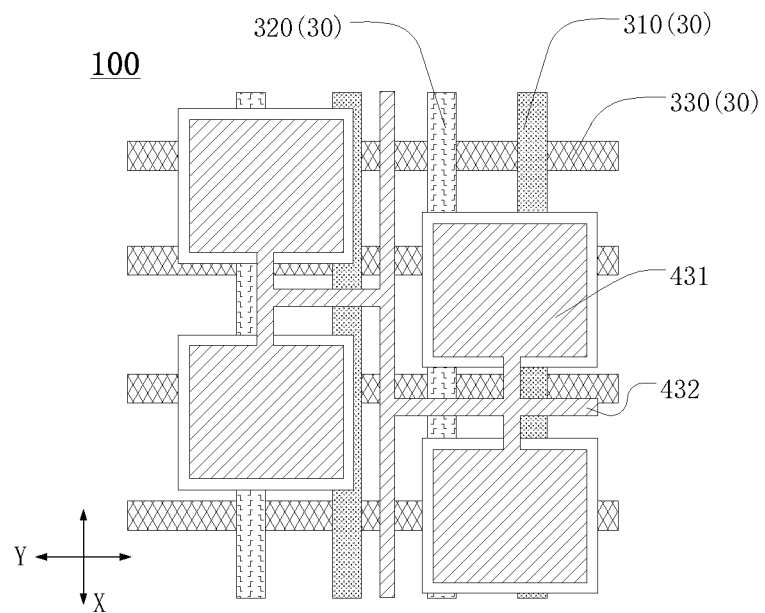
FIG. 16 illustrates a top view of another exemplary display panel according to various disclosed embodiments of the present disclosure.

FIG. 16 illustrates a top view of another exemplary display panel consistent with various disclosed embodiments of the present disclosure. As shown in FIG. 16, the auxiliary metal layer 30 may further include a third metal wiring portion 330 extending along the second direction Y. The second direction Y may intersect the first direction X, and may be parallel to the plane of the substrate 10.

In one embodiment, the auxiliary metal layer 30 may further include a second metal wiring portion 320 extending along the first direction X. When the first metal wiring portion 310 and the second metal wiring portion 320 are respectively the source voltage signal line PVDD and the data line data, the third metal wiring portion 310 may be used as a wiring crossing the source voltage signal line PVDD and the data line data. The third metal wiring portion may also be a reference voltage signal line ref, or a scan line scan, etc.

Along a direction perpendicular to the plane where the substrate 10 is located, at least a portion of the cathode connection line 432 may be parallel to the third metal wiring portion 330 and may extend along a same direction. To maintain the connection of the entire surface of the cathode, a plurality of cathode connection lines may respectively extend along the first direction X or the second direction Y. For example, the cathode connection lines extending along the first direction X and the cathode connection lines extending along the second direction Y may form uneven areas because of metal wiring portions underneath. Therefore, the first metal wiring portions, the second metal wring portions, and the third metal wiring portions under the cathode layer may all be set to be parallel to the cathode connection lines. Such a configuration may further reduce the formation of the reflective slope on the cathode layer. Accordingly, the formation of the irregular blazed grating structures along these directions may be avoided, and the problem of uneven brightness of the display panel caused by blazed gratings may be solved.

Figure 17:
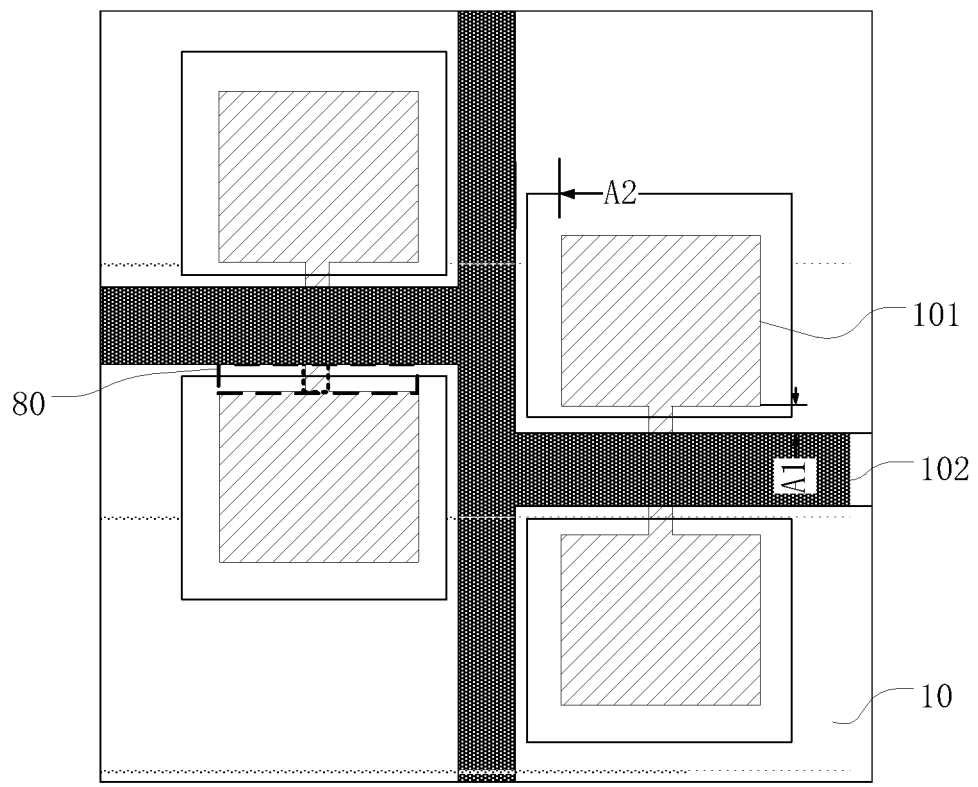
FIG. 17 illustrates a top view of another exemplary display panel according to various disclosed embodiments of the present disclosure.

FIG. 17 is a top view of another exemplary display panel according to various disclosed embodiments of the present disclosure. As shown in FIG. 17 and referring to FIG. 15, the orthographic projection of the first cathode 4311 on the substrate 10 may be referred to as a first orthographic projection 101, the orthographic projection of the black matrix 70 on the substrate 10 may be referred to as the second orthographic projection 102. The region between the edge of the first orthographic projection 101 and the edge of the second orthographic projection 102 having the minimum distance may referred to a minimum boundary area 80, and at least a portion of the second cathode 4312 may be located in the minimum boundary area 80. To improve the light extraction efficiency, the black matrix may not completely cover the surface of the barrier wall structure and at least a portion of the second cathodes may not be blocked by the black matrix. The second cathode may be located on the side wall of the barrier wall structure, and the slope angle may make it a reflective inclined surface. When there are two or more distance values between the same first orthographic projection and the adjacent second orthographic projection, such as A1 and A2, and A1<A2, then the second cathode may be led from a side having the second distance A2 and connected with the cathode connection line. Thus, in the embodiment of the present disclosure, by leading the second cathode from the region where the distance between the first cathode and the black matrix is the shortest, the exposed area of the second cathode may be reduced, and accordingly, the formation of the reflective slope may be reduced.

Figure 18:
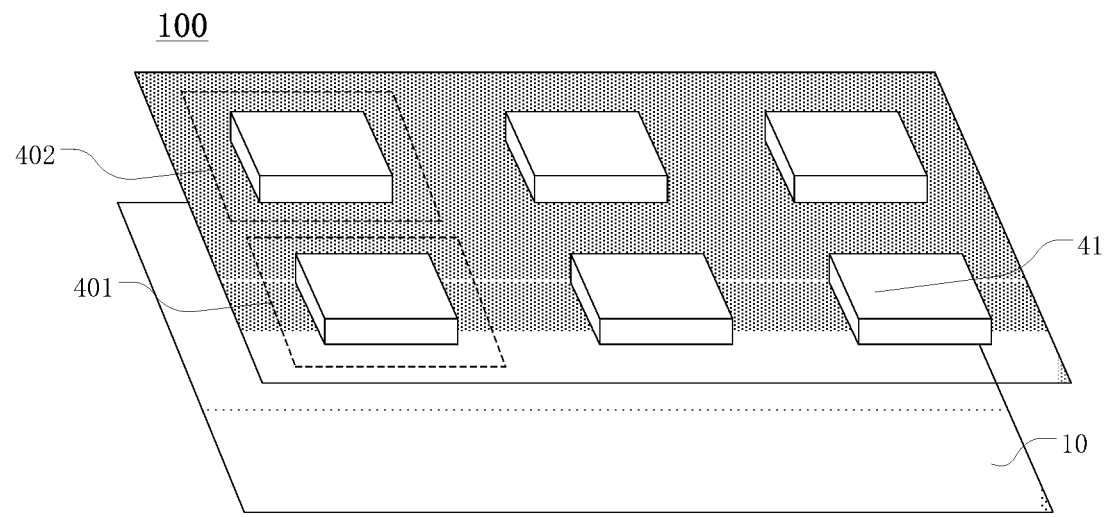
FIG. 18 illustrates a portion of another exemplary display panel consistent with various disclosed embodiments of the present disclosure.

FIG. 18 is a portion of another exemplary display panel according to various disclosed embodiments of the present disclosure. As shown in FIG. 18, in some embodiments, the display panel 100 may at least include a first pixel 401 and a second pixel 402 of different colors. Along the direction perpendicular to the plane of the substrate 10, the lengths and widths of the anode 43 of the first pixel 401 and the anode 43 of the second pixel 402 may all be same.

In one embodiment, the first pixel 401 may be a green sub-pixel, and the second pixel 402 may be a red sub-pixel. For example, the first pixel and the second pixel may emit light of different colors.

It should be noted that that the lengths and widths of the anode 43 of the first pixel 401 and the anode 43 of the second pixel 402 may all be same may mean that the anodes of different pixel units may have the same length and the widths of the anodes of different pixel units may also be same. Because the anodes may all be formed through the same process, the thicknesses of the corresponding anodes in different pixels may be same. For example, in the embodiment of the present disclosure, the lengths, widths and heights of the anodes in different pixel units may be same.

The existing diffraction grating structure may be the result of the superposition of multiple diffractions. The lengths and widths of the anode metals of the R/G/B pixels may be kept the same to keep the length of the diffraction fringes consistent in all directions and may form a more uniform diffraction pattern.

Figure 19:
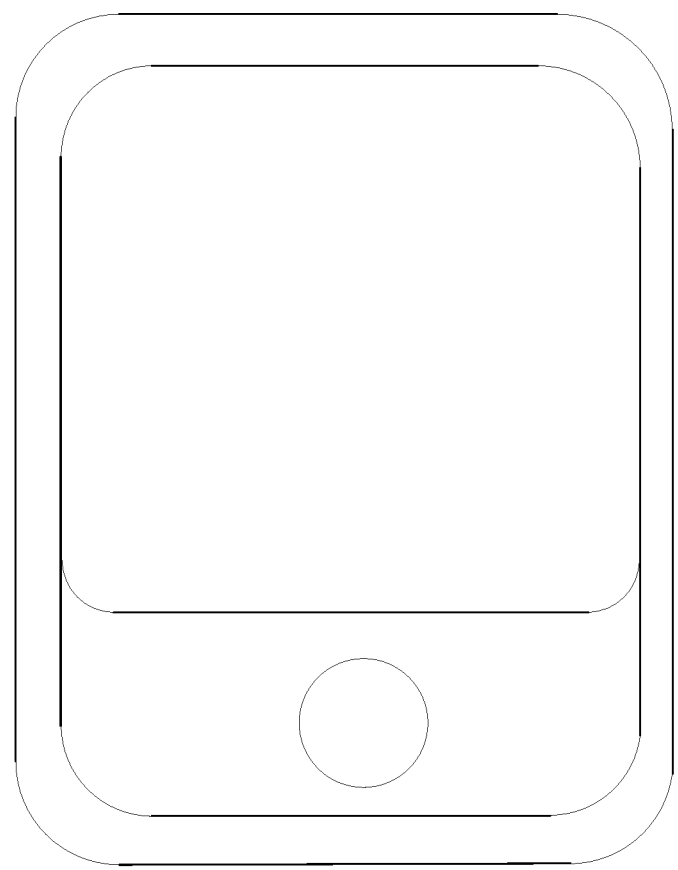
FIG. 19 illustrates an exemplary display device according to various disclosed embodiments of the present disclosure.

The present disclosure also provides a display device including the display panel provided by the present disclosure. FIG. 19 is a schematic structural diagram of an exemplary display device according to an embodiment of the present disclosure. As shown in FIG. 19, the display device 1000 may include the display panel provided by any one of the above-mentioned embodiments of the present disclosure. The embodiment of FIG. 19 only uses a television as an example to illustrate the display device 1000. It is understandable that the display device provided by the embodiment of the present disclosure may be a computer, a mobile phone, a vehicle-mounted display device, and other display devices with display functions; and the disclosure does not impose specific restrictions on this. The display device provided by the embodiment of the present disclosure may have the beneficial effects of the display panel provided by the embodiment of the present disclosure. For details, reference may be made to the specific description of the display panel in the foregoing embodiments, and details are not described herein again in this embodiment.

Thus, the present disclosure may have at least one of the following outstanding advantages.

The display panel of the present disclosure may be divided into the cathode blocks in the pixel openings and the cathode connection lines between the cathode blocks by patterning the cathode. On the one hand, it may ensure the entire surface of the cathode to be connected while the reflection area of the cathode layer may be reduced. Thus, the reduction to the reflection of external light may be reduced. On the other hand, setting the metal line under the cathode layer to be parallel to the cathode connection line may reduce the formation of reflective slopes of the cathode layer in some directions, an irregular blazed grating structure formed on these directions may be avoided. Thus, the problem of uneven brightness of the display screen caused by the blazed grating structure may be solved.

The above content is a further detailed description of the present disclosure in combination with specific preferred embodiments, and it cannot be considered that the specific implementation of the present disclosure is limited to these descriptions. For those of ordinary skill in the technical field to which the present disclosure belongs, a number of simple deductions or substitutions can be made without departing from the concept of the present disclosure, and they should all be regarded as belonging to the protection scope of the present disclosure.

What is claimed is:

1. A display panel, comprising:
a substrate;
an auxiliary metal layer, an anode layer, a pixel definition layer, a light-emitting layer and a cathode layer sequentially disposed on a side of the substrate, wherein the pixel definition layer includes a plurality of barrier wall structures, the plurality of barrier wall structures define a plurality of openings exposing the anode layer, the light-emitting layer is at least located in the plurality of openings, the cathode layer includes cathode blocks located in the plurality of openings, and the auxiliary metal layer includes a plurality of first metal wiring portions extending along a first direction; and
a plurality of cathode connection lines located among the cathode blocks, wherein the plurality of cathode connection lines connect the cathode blocks together in the plurality of openings and, along a direction perpendicular to a plane where the substrate is located, at least a portion of the plurality of cathode connection lines are parallel to multiple first metal wiring portions of the plurality of first metal wiring portions adjacent to the portion of the plurality of cathode connection lines,
wherein:
first metal wiring portions of the plurality of first metal wiring portions having overlapping portions with the plurality of cathode connection lines are arranged along a second direction with an equal interval; and
the second direction and the first direction are perpendicular to each other and parallel to the plane where the substrate is located.

2. The display panel according to claim 1, further comprising:
a driving transistor disposed between the pixel definition layer and the substrate, wherein the auxiliary metal layer is disposed on a side of the driving transistor away from the substrate.

3. The display panel according to claim 2, the auxiliary metal layer further comprises:
a plurality of second metal wiring portions extending along the first direction, wherein the plurality of first metal wiring portions and the plurality of second metal wiring portions are disposed in different layers, and orthographic projections of the plurality of first metal wiring portions on the substrate and orthographic projections of the plurality of second metal wiring portions on the substrate have overlapping portions.

4. The display panel according to claim 3, wherein:
the orthographic projections of the plurality of first metal wiring portions on the substrate cover the orthographic projections of the plurality of second metal wiring portions on the substrate.

5. The display panel according to claim 3, wherein:
the plurality of first metal wiring portions are source voltage signal lines; and
the plurality of second metal wiring portions are data lines.

6. The display panel according to claim 1, wherein:
an area where the light-emitting layer is located forms a plurality of light-emitting areas; and
along the direction perpendicular to the plane where the substrate is located, the plurality of first metal wiring portions do not overlap the plurality of light-emitting areas, and/or the plurality of first metal wiring portions do not overlap the plurality of cathode connection lines.

7. The display panel according to claim 1, wherein the auxiliary metal layer further comprises:
a plurality of second metal wiring portions extending along the first direction,
wherein:
an area where the light-emitting layer is located includes a plurality of light-emitting areas;
along the direction perpendicular to the plane where the substrate is located, first metal wirings of the plurality of first metal wirings and second metal wirings of the plurality of second metal wirings in a same light-emitting area of the plurality of light-emitting areas are symmetric along a first central line;
the first central line is a central symmetrical axis of the light-emitting area; and
the central symmetrical axis is parallel to the first direction.

8. The display panel according to claim 1, wherein:
a cathode block of the cathode blocks includes a first cathode and a second cathode connected to each other;

the first cathode is parallel to the plane where the substrate is located;

the second cathode is located on a side of the first cathode away from the substrate and on at least a portion of a side wall of a barrier wall structure of the plurality of barrier wall structures; and a cathode connection line of the plurality of cathode connection lines is disposed on a side of the barrier wall structure away from the substrate and connected with the first cathode through the second cathode.

9. The display panel according to claim 8, wherein:

along a direction from the cathode layer to the substrate, a width of the barrier wall structure is progressively increased;

the barrier wall structure includes a first sidewall and a second sidewall facing an opening of the plurality of openings;

an angle between the first sidewall and a side of the pixel definition layer that is connected with the first sidewall and adjacent to the substrate is a first angle $\theta1$;

an angle between the second sidewall and the side of the pixel definition layer that is connected with the second sidewall and adjacent to the substrate is a second angle $\theta2$, and $30°<\theta1<\theta2<90°$; and the second cathode is disposed on the first sidewall.

10. The display panel according to claim 9, wherein:

along the direction perpendicular to the plane wherein the substrate is located, the second cathode and the first metal wiring portions are parallel to each other and overlap each other.

11. The display panel according to claim 9, wherein:

second cathodes are periodically arranged along a third direction; and the third direction is parallel to the plane where the substrate is located.

12. The display panel according to claim 1, further comprising:

a black matrix disposed on a side of the plurality of cathode connection lines away from the substrate;

wherein:

the black matrix includes a plurality of first black matrix units extending along the first direction and arranged along the second direction and a plurality of second black matrix units extending along the second direction and arranged along the first direction;

the plurality of first black matrix units and the plurality of second black matrix units cross each other to expose the plurality of openings; and along the direction perpendicular to the plane where the substrate is located, at least a portion of the plurality of first black matrix units cover the plurality of cathode connection lines.

13. The display panel according to claim 12, wherein:

central axis of at least a portion of the plurality of first black matrix units and central axis of cathode connection lines covered by the portion of the plurality of first black matrix units coincide.

14. The display panel according to claim 12, wherein: the plurality of cathode lines are double-layered wirings.

15. The display panel according to claim 14, wherein:

the double-layered wirings are electrically connected with each other through first transition portions; and a conductivity of the first transition portions is greater than a connectivity of the double-layered wirings.

16. The display panel according to claim 12, wherein:

an orthographic projection of the first cathode on the substrate is a first orthographic projection;

an orthographic projection of the black matrix on the substrate is a second orthographic projection;

a region having a minimum distance between an edge of the first orthographic projection and an edge of the second orthographic projection is a minimum boundary region; and at least a portion of the second cathode is located in the minimum boundary region.

17. The display panel according to claim 1, wherein the auxiliary metal layer further comprises:

a plurality of third metal wiring portions extending along the second direction, wherein along the direction perpendicular to the plane where the substrate is located, at least a portion of the plurality of cathode connection lines and the plurality of third metal wiring portions are parallel to each other and have a same extending direction.

18. A display device, comprising:

a display panel, including:

a substrate;

an auxiliary metal layer, an anode layer, a pixel definition layer, a light-emitting layer and a cathode layer, sequentially disposed on a side of the substrate, wherein the pixel definition layer includes a plurality of barrier wall structures, the plurality of barrier wall structures define a plurality of openings exposing the anode layer, the light-emitting layer is at least located in the plurality of openings, the cathode layer includes cathode blocks located in the plurality of openings, and the auxiliary metal layer includes a plurality of first metal wiring portions extending along a first direction; and a plurality of cathode connection lines located among the cathode blocks, wherein the plurality of cathode connection lines connect the cathode blocks in the plurality of openings and, along a direction perpendicular to a plane where the substrate is located, at least a portion of the plurality of cathode connection lines are parallel to multiple first metal wiring portions of the plurality of first metal wiring portions adjacent to the portion of the plurality of cathode connection lines, wherein:

first metal wiring portions of the plurality of first metal wiring portions having overlapping portions with the plurality of cathode connection lines are arranged along a second direction with an equal interval; and the second direction and the first direction are perpendicular to each other and parallel to the plane where the substrate is located.

19. A display panel, comprising:

a substrate;

an auxiliary metal layer, an anode layer, a pixel definition layer, a light-emitting layer and a cathode layer sequentially disposed on a side of the substrate, wherein the pixel definition layer includes a plurality of barrier wall structures, the plurality of barrier wall structures define a plurality of openings exposing the anode layer, the light-emitting layer is at least located in the plurality of openings, the cathode layer includes cathode blocks located in the plurality of openings, and the auxiliary metal layer includes a plurality of first metal wiring portions extending along a first direction; and a plurality of cathode connection lines located among the cathode blocks, wherein the plurality of cathode connection lines connect the cathode blocks together in the plurality of openings and, along a direction perpendicular to a plane where the substrate is located, at least a portion of the plurality of cathode connection lines are parallel to multiple first metal wiring portions of the plurality of first metal wiring portions adjacent to the portion of the plurality of cathode connection lines, wherein:
first metal wiring portions of the plurality of first metal wiring portions having overlapping portions with the plurality of cathode connection lines are arranged along a second direction with an equal interval;
the second direction and the first direction are perpendicular to each other and parallel to the plane where the substrate is located; and
a width of at least one of the cathode connection lines along the second direction is smaller than a width of at least one of the cathode blocks along the second direction.

20. A display device, comprising the display panel according to claim 19.

* * * * *